(12) United States Patent
Halstead et al.

(10) Patent No.: US 6,995,570 B2
(45) Date of Patent: Feb. 7, 2006

(54) METHOD AND APPARATUS FOR DETECTING CONDITIONS IN PARALLELED DC POWER CABLES

(75) Inventors: David C. Halstead, Rochester, NY (US); Michael R. Gilbert, Rochester, NY (US)

(73) Assignee: ENI Technology, Inc., Rochester, NY (US)

( * ) Notice: Subject to any disclaimer, the term of this patent is extended or adjusted under 35 U.S.C. 154(b) by 341 days.

(21) Appl. No.: 10/180,273

(22) Filed: Jun. 26, 2002

(65) Prior Publication Data

US 2004/0000916 A1 Jan. 1, 2004

(51) Int. Cl.
*G01R 31/02* (2006.01)

(52) U.S. Cl. ........................................ 324/539; 324/542

(58) Field of Classification Search ................ 324/542, 324/539
See application file for complete search history.

(56) References Cited

U.S. PATENT DOCUMENTS

| | | | | |
|---|---|---|---|---|
| 3,944,914 | A | * | 3/1976 | Simmonds .................. 324/539 |
| 4,074,187 | A | * | 2/1978 | Miller et al. ................ 324/542 |
| 4,484,131 | A | * | 11/1984 | Jenkinson ................... 324/533 |
| 4,575,588 | A | * | 3/1986 | Vande Vyver ................ 379/22 |
| 4,609,865 | A | | 9/1986 | Goodman et al. |
| 4,651,084 | A | | 3/1987 | Welsh et al. |
| 4,820,991 | A | * | 4/1989 | Clark .......................... 324/519 |
| 4,887,041 | A | | 12/1989 | Mashikian et al. |
| 4,896,114 | A | | 1/1990 | Donner |
| 5,414,343 | A | * | 5/1995 | Flaherty et al. ............... 324/66 |
| 5,530,365 | A | | 6/1996 | Lefeldt |
| 5,570,028 | A | | 10/1996 | Sperlazzo et al. |
| 5,600,248 | A | | 2/1997 | Westrom et al. |
| 5,608,328 | A | | 3/1997 | Sanderson |
| 5,714,885 | A | | 2/1998 | Lulham |
| 5,754,040 | A | | 5/1998 | Shannon |
| 5,894,223 | A | | 4/1999 | Medelius et al. |
| 5,922,996 | A | | 7/1999 | Ryeczek |
| 5,946,172 | A | | 8/1999 | Hansson et al. |
| 5,977,773 | A | | 11/1999 | Medelius et al. |
| 5,986,860 | A | | 11/1999 | Scott |
| 6,163,084 | A | | 12/2000 | Yamaguchi |
| 6,512,378 | B2 | * | 1/2003 | Fernandez ................... 324/539 |

FOREIGN PATENT DOCUMENTS

JP         10332771 A    * 12/1998

* cited by examiner

*Primary Examiner*—Minh Chau
(74) *Attorney, Agent, or Firm*—Harness, Dickey & Pierce, P.L.C.

(57) ABSTRACT

To provide protection for power supplies in which a plurality of paralleled identical DC power cables are provided between a source and a load, one aspect of the present invention provides a method for detecting conditions in parallel DC power cables. The method includes supplying current from a power supply to each of a plurality of DC power cables, determining an average current per cable flowing in the plurality of parallel DC power cables, comparing currents in each of the DC power cables with the determined average current, and signaling the existence of a condition in response to the comparison.

17 Claims, 4 Drawing Sheets

METHOD AND APPARATUS FOR DETECTING CONDITIONS IN PARALLELED DC POWER CABLES

FIELD OF THE INVENTION

The present invention relates to methods and apparatus for condition detection in power supplies, and more particularly to methods and apparatus for detection of and protection from certain conditions in paralleled DC power cables between a source and a load.

BACKGROUND OF THE INVENTION

In some applications in which power is provided to high current loads, DC power cables are run in parallel between a power supply and the high current load. For example, parallel DC power cables may be used to supply power to plasma chambers that are used for manufacturing of semiconductor wafers, flat panel displays, compact disks, hard coatings, and other objects. To provide sufficient current to operate the plasma chamber, one known DC power supply comprising a DC plasma generator supplies current to two or three identical DC cables. These cables each carry up to 40 to 60 amperes at voltages up to 500 to 800 volts DC. The cables are typically coaxial power cables that connect to terminations at the DC plasma generator.

Overcurrent devices or circuits are known that are useful for protecting DC plasma generators, cables, and the plasma chamber in the event of an overload. However, overcurrent devices do not provide protection from some conditions. For example, overcurrent devices do not indicate or provide protection in the event of a poor cable connection or a break within a cable.

SUMMARY OF THE INVENTION

To provide protection for certain conditions in which a plurality of paralleled DC power cables are provided between a DC power source and a load, one aspect of the present invention provides a method for detecting conditions in parallel DC power cables. The method includes supplying current from a power supply to each of a plurality of DC power cables, determining an average current per cable flowing in the plurality of parallel DC power cables, comparing currents in each of the DC power cables with the determined average current, and signaling the existence of a condition in response to the comparison.

In another aspect, the present invention provides a condition detecting apparatus for cables connecting a power supply to a load. The condition detecting apparatus is configured to determine an average current per cable flowing in a plurality of parallel DC power cables connected to the DC power supply, compare currents in each of the DC power cables with the determined average current, and signal the existence of a condition in response to the comparison.

In yet another aspect, the present invention provides a DC power supply configured to supply power to a load through a plurality of parallel DC cables. The power supply includes a DC current source, connectors coupled to the DC current source and configured to provide current from the DC current source to a plurality of parallel DC cables, current sensors configured to measure DC current flowing through each of the connectors, an averaging circuit responsive to the current sensors and configured to determine an average of the measured DC currents, a comparison circuit responsive to the averaging circuit and to the current sensors and configured to compare measured DC current flowing through each of the connectors with the average of the measured DC currents, and a control circuit responsive to the comparator and configured to shut down the DC current source when the comparator detects that at least one of the measured DC currents drops below the average of the measured DC currents by a predetermined percentage of the average current.

Embodiments of the present invention provide condition detection for partially loaded power supplies (and each paralleled cable) when only partially loaded, in contrast to overcurrent devices that only protect during an overload.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENT(S)

The following description of the preferred embodiment(s) is merely exemplary in nature and is in no way intended to limit the invention, its application, or uses.

As used herein, "current magnitude" refers to an amount of current flowing, irrespective the direction in which it is flowing. Also as used herein, an "average current" refers to an average current magnitude, and a measured current is less than an average current when the measured current magnitude is less than the average current magnitude.

Figure 1:
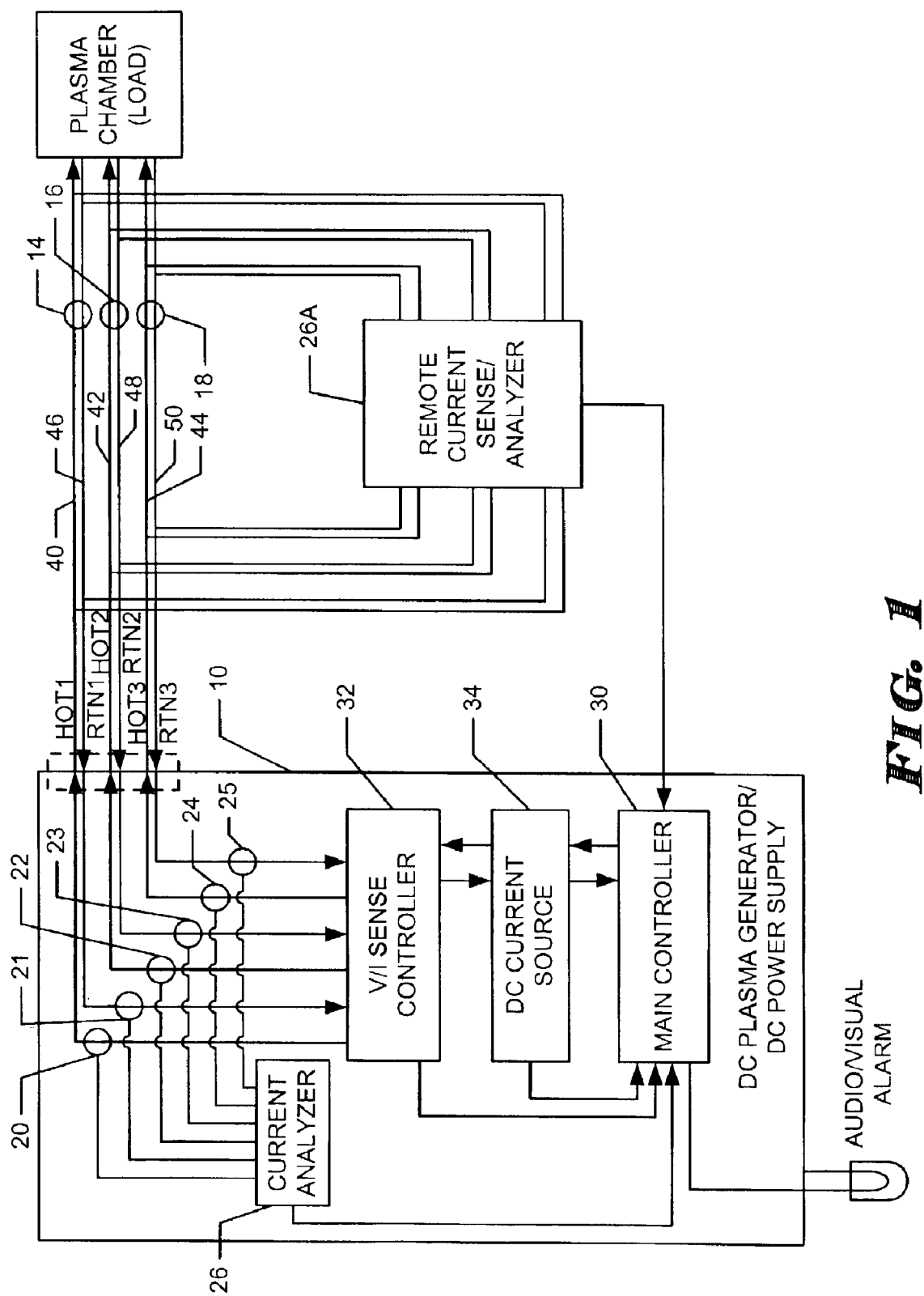
FIG. 1 is a block diagram representative of one configuration of the present invention.

In one configuration of the present invention and referring to FIG. 1, a power supply 10 provides a source of DC current to a load 12 via two or more parallel DC power cables, for example three DC power cables 14, 16 and 18. Hall effect sensors 20, 22 and 24 in connectors utilized to connect DC power cables 14, 16 and 18, respectively, to power supply 10 are utilized to sense the magnitude of current flowing through the connectors to each cable. Alternately, resistors are used to sense current flowing in cables 14, 16 and 18, and current is sensed as a voltage drop across each resistor. In yet another alternative, cables 14, 16 and 18 are passed through current sensors such as a LEM LA 100-P closed loop sensor, available from LEM Holding SA, Geneva, Switzerland.

Separate signals provided by current sensors 20, 21, 22, 23, 24 and 25 are indicative of current flow in corresponding monitored cables 14, 16, and 18. Analyzer 26 analyzes these separate signals by determining an average current flow per cable and comparing currents in individual cables 14, 16 and 18 to the determined average current. In one configuration, a remote current sensor/analyzer 26A with remote current sensors is utilized instead of or in addition to internal analyzer 26 and current sensors 20, 21, 22, 23, 24 and 25.

Normally, current supplied to load 12 is distributed equally in parallel DC power cables 14, 16 and 18. A broken cable or a loose connection may result in an unequal distribution of current. Thus, one configuration of the present invention activates a condition signal when the current in any monitored cable 14, 16 or 18 is less than the determined average current by a predetermined amount. For example, if the current in one of cables 14, 16 or 18 is 5% less than the average current of all three cables, this condition is signaled. An audible or visual alarm 28 is provided to signal the condition. An electrical signal is also provided to controller 30 of power supply 10 to shut down current 32 supplied to cables 14, 16 and 18 from current source 34 in an orderly manner. Analyzer 26 is configured to inhibit generation of the condition signal and shutdown of power supply 10 when power supply 10 is lightly loaded, to prevent false alarms and nuisance shutdowns.

One configuration of power supply 10 not shown in FIG. 1 includes a battery back-up source, which is also electrically disconnected from cables 14, 16 and 18. In this configuration, a plurality of DC power cables connects a battery to power supply 10, and sensors are provided so that cable faults in the DC cables connecting the battery to power supply 10 are detected.

An overcurrent protection circuit such as a fuse, circuit breaker or electronic shutdown circuit, is provided to limit current flowing in the two or more parallel DC cables 14, 16 and 18. In the configuration illustrated in FIG. 1, an electronic shutdown circuit is not separately illustrated, but is included in main controller 30. A loose connection or a broken cable condition that results in a reduced flow of current in one or more cables 14, 16 or 18 will not activate the overcurrent protection circuit. However, analyzer 26 does not depend upon the current limit set by the overcurrent protection circuit. Instead, analyzer 26 signals a condition when the current flowing in at least one of DC cables 14, 16 and 18 is a predetermined percentage less than an average of the current flow in each cable. This condition is signaled even when the total current drawn by load 12 or the current flowing in any individual cable 14, 16 or 18 is less than a maximum current permitted by the overcurrent protection circuit, so that the overcurrent protection circuit is not activated.

For example, in one configuration, power supply 10 is a DC plasma generator configured to provide current to a load 12 comprising a plasma chamber. Three output cables 14, 16 and 18 provide a total current of 120 amperes from power supply 10, with each cable providing 40 amperes. The overcurrent protection circuit is set to limit when the total current drawn by load 12 is greater than 120 amperes, for example, 126 amperes. However, analyzer 26 will cause power supply 10 to shut down if the current in output cables 14 and 16 remain constant and the current in output cable 18 drops below a specified threshold, or if cables 14, 16, and 18 all exceed threshold.

In one configuration, parallel DC supply cables 14, 16 and 18 are coaxial cables connected to power supply 10 via standard PL-259 and SO-259 coaxial connectors. Coaxial cables 14,16 and 18 comprise hot leads 40, 42 and 44, respectively, and return leads 46, 48 and 50, respectively. A condition may occur in either the hot lead of a coaxial cable or the return lead. Therefore, a first set of current sensors 20, 22 and 24 is configured to sense current flowing in hot leads 40, 42 and 44. A separate, second set of sensors 21, 23, and 25 is also provided and is configured to sense current in return leads 46, 48 and 50. Such sensors may be embedded in specially fabricated cables, for example, or may be incorporated into specially designed connectors or adapters. An average current magnitude is determined utilizing all of the sensors from either the first set of sensors 20, 22 and 24, the second set of sensors 21, 23, and 25, or both sets of sensors. A condition is signaled if the current magnitude in any of leads 40, 42, 44, 46, 48 or 50 drops below a predetermined percentage of the determined average current magnitude.

Figure 2:
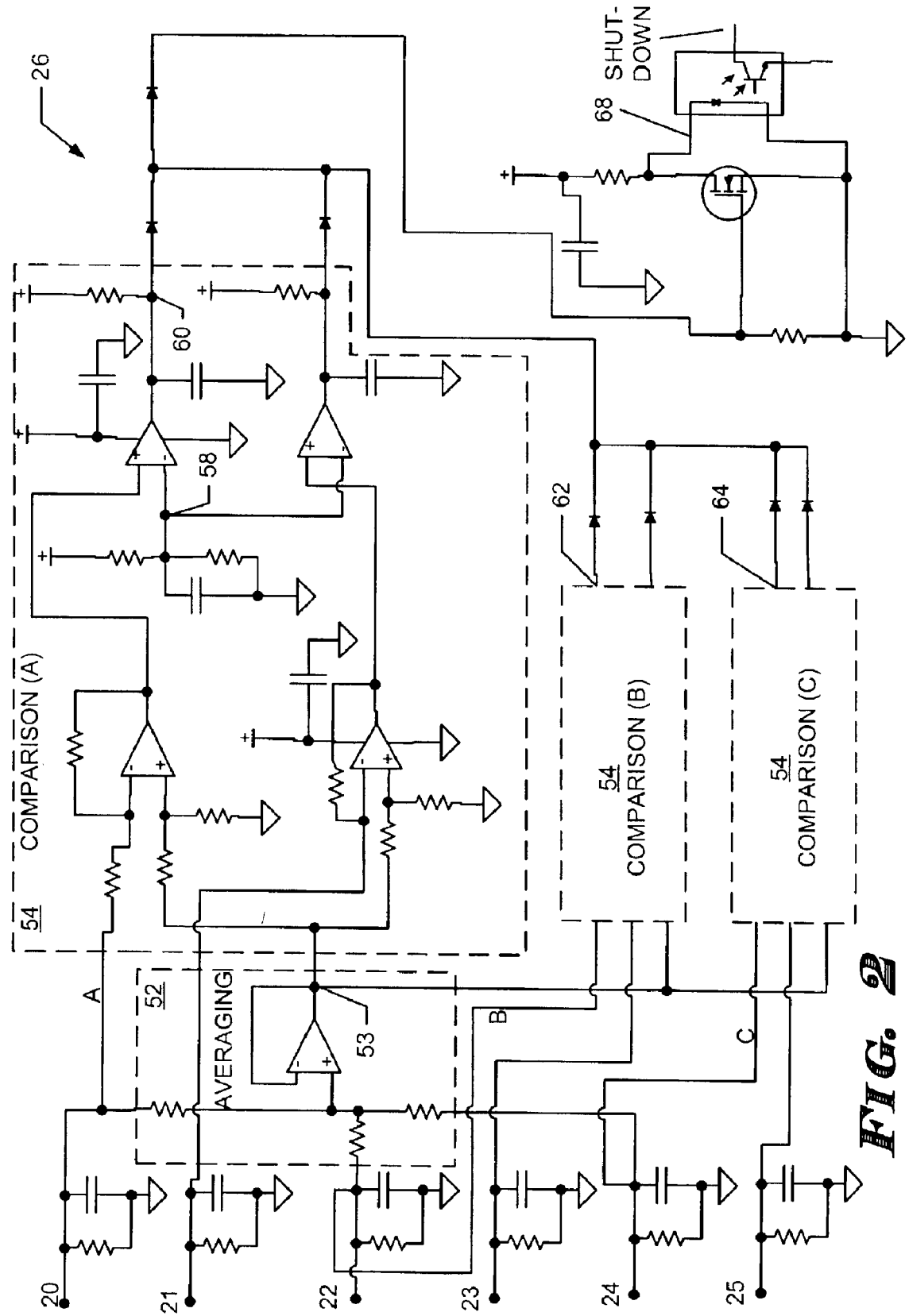
FIG. 2 is a schematic diagram of an analyzer circuit useful for the configuration represented in FIG. 1.

Referring to FIG. 2, analyzer 26 comprises an averaging circuit 52 and a comparison circuit 54. Averaging circuit 52 determines an average current magnitude flowing in each of DC power supply cables 14, 16 and 18 utilizing signals from sensors 20, 22 and 24. Averaging circuit 52 produces a signal 53 representative of the average current magnitude to comparison circuit 54. Comparison circuit 54 compares the average current magnitude to the actual current measured in each hot and return conductor of each DC power supply cable by sensor 20, 21, 22, 23, 24 and 25 utilizing comparators such as comparator 58 to generate separate signals 60, 62 and 64 indicative of cable conditions in cables 14, 16 and 18, respectively. A reference voltage at an input of comparator 58 (and other comparators not shown in FIG. 3) is scaled to a desired error limit. In normal operation, small deviations from the average current flow may occur in each cable 14, 16, and 18. The error limit is set to prevent activation of signals 60, 62 and 64 unless the current magnitude measured by at least one of sensor 20, 22 or 24 falls below average by at least a predetermined amount. In one configuration, even when the current magnitude measured by at least one sensor 20, 21, 22, 23, 24 or 25 falls below average by the predetermined percentage set for signaling a condition, a condition is not signaled as long as the magnitude of the difference is less than a predetermined amount.

Signals 60, 62 and 64 are analyzed to determine and signal the existence of a condition. A condition signal 68 is generated when any of signals 60, 62 and 64 are active.

Figure 3:
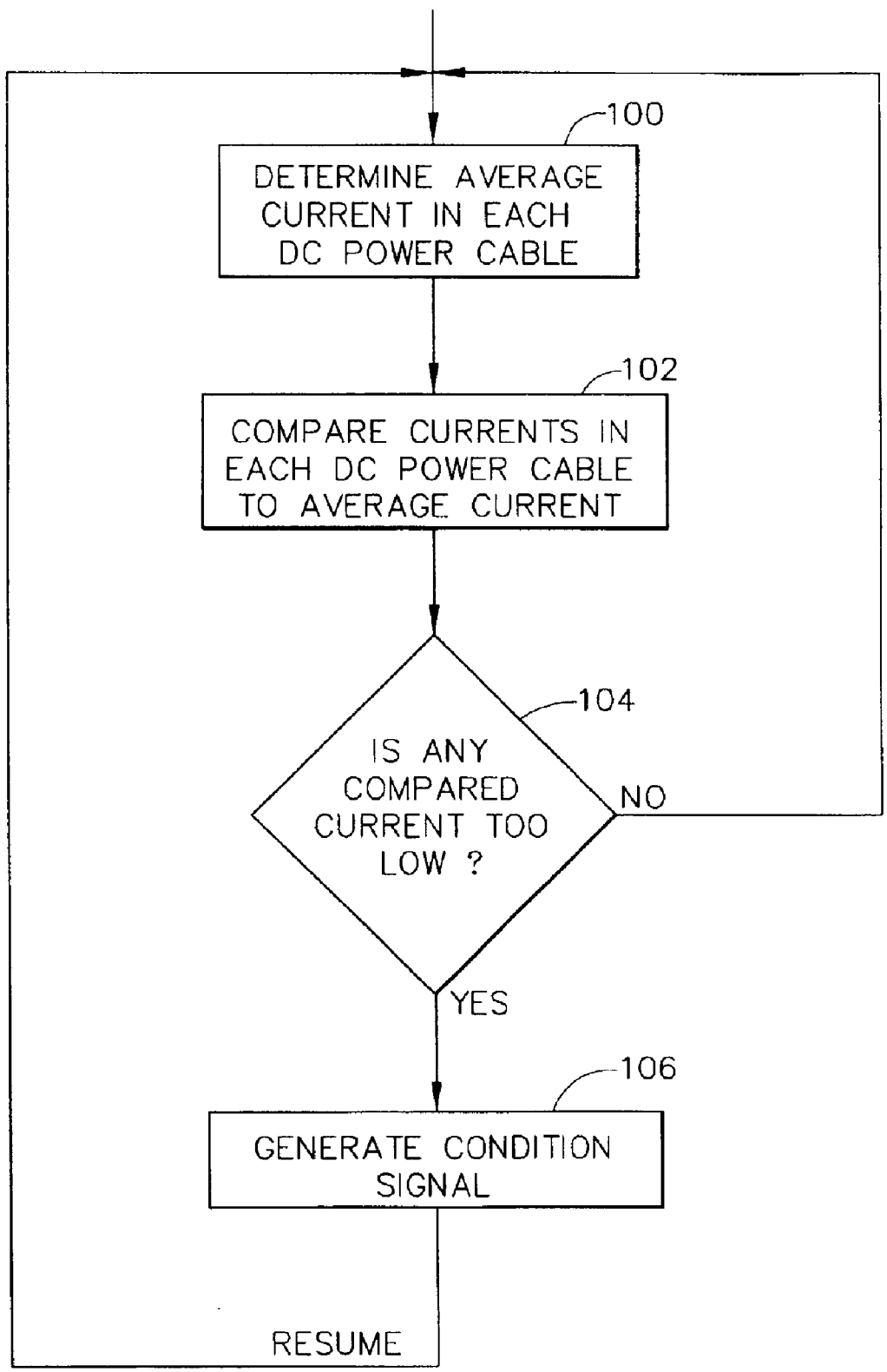
FIG. 3 is a flow chart of a program suitable for controlling a digital signal processor utilized as an analyzer circuit in the configuration represented in FIG. 1.

In one configuration, analyzer 26 is a digital signal processor (DSP) controlled by a program in software or firmware. A flow chart of one such program is represented in FIG. 3. Current is supplied to a load 12 through a plurality of DC power cables 14, 16 and 18. Analyzer 26 utilizes signals from sensors 20, 22 and 24 to determine 100 an average current magnitude flowing in each of the hot leads of DC power cables 14, 16 and 18. The average currents in each DC power cable 14, 16 and 18 are compared to the average current. In another configuration, additional sensors are provided to measure currents in return leads of DC power cables 14, 16 and 18, and signals from these sensors are also utilized to determine the average current magnitude and in the comparison to the average current. If none of the compared currents are a predetermined percentage less than the determined average current, another average is computed 100 and comparison 102 is performed again. Otherwise, a condition is signaled 106. Depending upon the circumstances of the condition, execution of the DSP program may resume at step 100 and power may continue to be provided to load 12.

Figure 4:
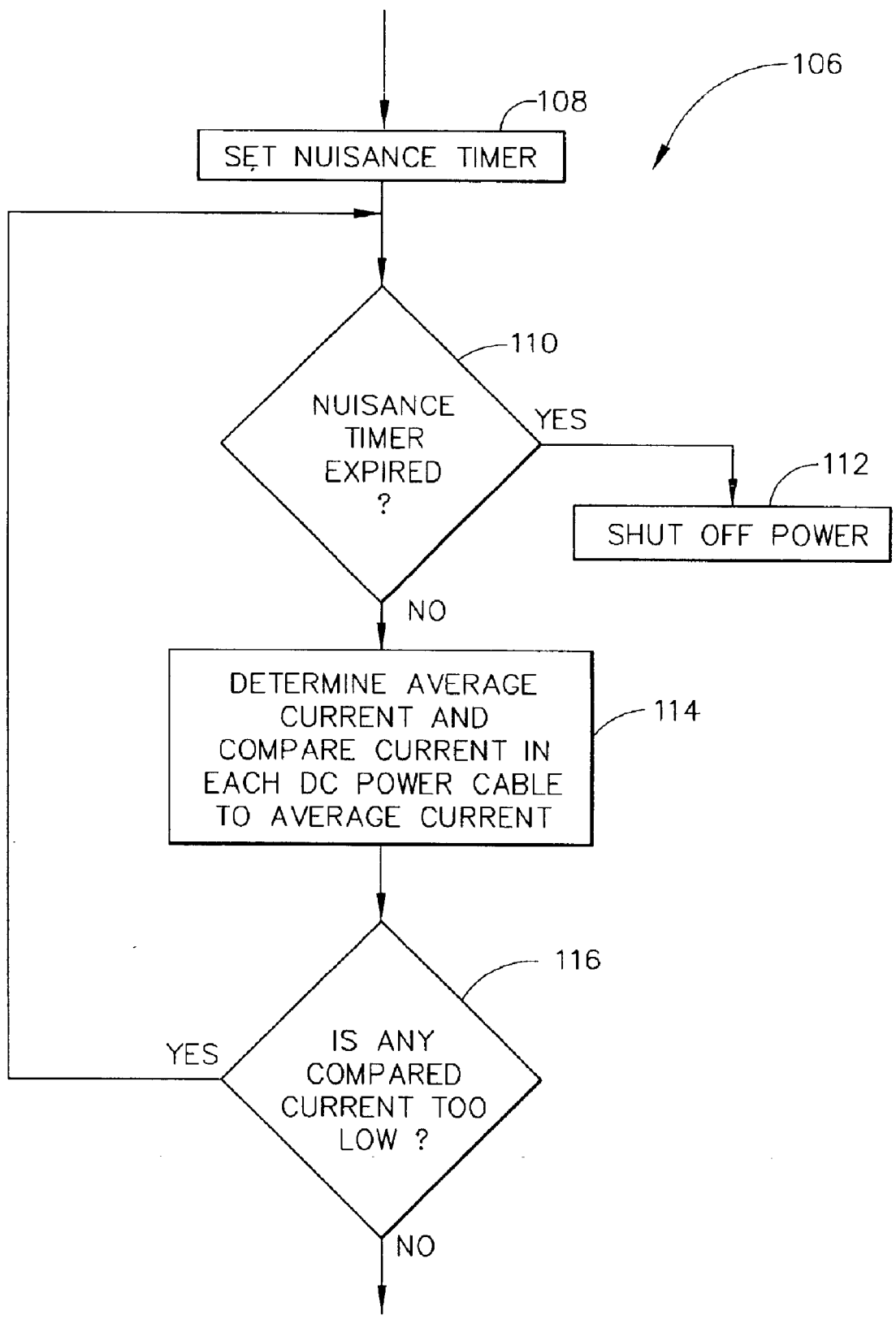
FIG. 4 is a flow chart providing further details of the condition signaling function represented in the flow chart of FIG. 3.

FIG. 4 is a simplified flow chart showing a portion of condition signaling function step 106 in greater detail. When a decision 104 is made that a compared current is too low, a nuisance timer 108 is set to prevent shutting off power due to spurious noise transients. A check 110 is then made to determine whether the nuisance timer has expired. If the nuisance timer has expired, a signal is sent to control circuit 30 to perform an orderly shutdown of power from power supply 10. Otherwise, another average current is determined and another comparison 114 is performed between the average current and each individual current. If no compared current is too low, a decision 116 is made to resume execution at step 100 in FIG. 3. Otherwise, another nuisance timer is checked again 110, and if the nuisance timer has expired, power is shut off 112.

It will thus be recognized that configurations of the present invention provide enhanced protection against various conditions in all types of power supplies in which current is supplied to a load via a plurality of parallel DC power supply cables. Conditions occurring in the DC supply cables are detected, and power shut down in appropriate instances, even in the absence of an overload condition drawing excess current from the power supply. Although configurations of the present invention are applicable to DC power supplies generally, they are particularly useful in conjunction with DC plasma generators. Protection apparatus and methods incorporating configurations of the present invention may be provided as external accessories to DC power supplies. However, other configurations of the present invention include DC power supplies comprising such protection apparatus and methods.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for detecting conditions in parallel DC power cables comprising:
   supplying current from a power supply simultaneously to each of a plurality of DC power cables;
   determining an average current per cable flowing in the plurality of parallel DC power cables;
   comparing currents in each of the DC power cables with the determined average current; and signaling the existence of a condition in response to the comparison, said signaling including shutting down the power supply that is providing current to the plurality of DC power cables.

2. A method in accordance with claim 1 wherein said determining an average current comprises utilizing a first set of sensors to measure currents in hot leads of each of the DC power cables, and a second set of sensors to measure currents in return leads of each of the DC power cables.

3. A method in accordance with claim 1 wherein said comparing currents in each of the DC power cables further comprises utilizing separate comparators to monitor a difference between currents in each of the DC power cables and the determined average current.

4. A method in accordance with claim 3 wherein said signaling the existence of a condition comprises activating a cable condition signal corresponding to one of said DC power cables when current in said corresponding DC power cable drops below the determined average current by a predetermined percentage of the average current.

5. A method in accordance with claim 4 wherein said signaling the existence of a condition further comprises analyzing the cable condition signals corresponding to each of the plurality of DC power cables.

6. A method in accordance with claim 1 wherein current for the plurality of DC power cables is supplied by a DC plasma generator.

7. A method in accordance with claim 1 wherein a maximum power supply current is limited by an overcurrent protection circuit, and wherein said signaling a condition comprises signaling a condition when the total current in all of the DC supply cables is less than the maximum total current.

8. A condition detecting apparatus for cables connecting a DC power supply to a load, said apparatus configured to:
   determine an average current per cable flowing in a plurality of parallel DC power cables simultaneously connected to the DC power supply;
   compare currents in each of the DC power cables with the determined average current; and
   signal the existence of a condition in response to the comparison; and shut down a power supply that is providing current to the plurality of DC power cables in response to said condition signal.

9. An apparatus in accordance with claim 8 comprising a first set of current sensors and a second set of current sensors, and wherein to determine an average current, said apparatus is configured to utilize the first set of current sensors to measure currents in hot leads of each of the DC power cables and a second set of sensors to measure currents in return leads of each of the DC power cables.

10. An apparatus in accordance with claim 9 further comprising separate comparators configured to monitor a difference between currents in each of the DC power cables and the determined average current.

11. An apparatus in accordance with claim 10 configured to activate a cable condition signal corresponding to one of said DC power cables when current in said corresponding DC power cable drops below the determined average current by a predetermined percentage of the average current.

12. An apparatus in accordance with claim 11 further configured to analyze cable condition signals corresponding to each of the DC power cables to signal the existence of a condition.

13. A DC power supply configured to supply power to a load through a plurality of parallel DC cables, said power supply comprising:
   a DC current source;
   connectors coupled to the DC current source and configured to provide current from the DC current source to a plurality of parallel DC cables;
   current sensors configured to measure DC current flowing through each of the connectors;
   an averaging circuit responsive to the current sensors and configured to determine an average of the measured DC currents;
   a comparison circuit responsive to the averaging circuit and to the current sensors and configured to compare measured DC current flowing through each of the connectors with the average of the measured DC currents; and
   a control circuit responsive to the comparison circuit and configured to shut down the DC current source when the comparison circuit detects that at least one of the measured DC currents has dropped below the average of the measured DC currents by a predetermined percentage of the average current.

14. A power supply in accordance with claim 13 wherein the DC current source comprises a DC plasma generator.

15. A power supply in accordance with claim 14 having current sensors configured to measure current in both the hot lead of DC cables connected to the connectors and the return leads of DC cables connected to the connectors.

16. A power supply in accordance with claim 14 further comprising an overcurrent protection circuit, and further wherein the control circuit is configured to shut down the power supply in response to the comparison circuit even though the power supply is operating within a current limit of the overcurrent protection circuit.

17. A power supply in accordance with claim 13 further comprising an overcurrent protection circuit, and further wherein the control circuit is configured to shut down the power supply in response to the comparator even though the power supply is operating within a limit of the overcurrent protection circuit.

* * * * *